United States Patent
Ono et al.

(10) Patent No.: US 11,462,608 B2
(45) Date of Patent: Oct. 4, 2022

(54) LARGE PANEL DISPLAYS WITH REDUCED ROUTING LINE RESISTANCE

(71) Applicant: Apple Inc., Cupertino, CA (US)

(72) Inventors: Shinya Ono, Santa Clara, CA (US); Chin-Wei Lin, San Jose, CA (US); Akira Matsudaira, Santa Clara, CA (US); Jiun-Jye Chang, Cupertino, CA (US); Jung Yen Huang, Taoyuan (TW); Pei-En Chang, San Jose, CA (US); Rungrot Kitsomboonloha, San Jose, CA (US); Szu-Hsien Lee, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 14 days.

(21) Appl. No.: 17/143,939

(22) Filed: Jan. 7, 2021

(65) Prior Publication Data

US 2021/0305353 A1 Sep. 30, 2021

Related U.S. Application Data

(60) Provisional application No. 62/994,747, filed on Mar. 25, 2020.

(51) Int. Cl.
*G09G 3/3225* (2016.01)
*G09G 3/3266* (2016.01)
(Continued)

(52) U.S. Cl.
CPC ....... *H01L 27/3279* (2013.01); *G09G 3/3225* (2013.01); *G09G 3/3266* (2013.01); *H01L 27/3258* (2013.01); *H01L 27/3262* (2013.01); *H01L 27/3265* (2013.01); *G09G 2310/0202* (2013.01); *G09G 2320/0233* (2013.01); *G09G 2330/02* (2013.01); *H01L 27/124* (2013.01); *H01L 27/1225* (2013.01); *H01L 27/1251* (2013.01); *H01L 27/1255* (2013.01); *H01L 29/4908* (2013.01); *H01L 29/7869* (2013.01); *H01L 29/78618* (2013.01); *H01L 29/78675* (2013.01)

(58) Field of Classification Search
CPC ............... G09G 3/3225; G09G 3/3266; G09G 2310/0202; G09G 2320/0233; G09G 2330/02
See application file for complete search history.

(56) References Cited

U.S. PATENT DOCUMENTS 5,610,738 A 3/1997 Sasano et al.
8,878,186 B2 11/2014 Ono
(Continued)

*Primary Examiner* — Kevin M Nguyen
(74) *Attorney, Agent, or Firm* — Treyz Law Group, P.C.; Jason Tsai

(57) ABSTRACT

An electronic device may include a display with pixels formed using light-emitting diodes, thin-film silicon transistors, thin-film semiconducting-oxide transistors, and capacitors. The silicon transistors, semiconducting-transistors, and capacitors may have control terminals that are coupled to gate or routing lines that extend across the face of the display and that are formed in a low resistance source-drain metal routing layer. Forming routing/gate lines using the low resistance source-drain metal routing layer dramatically reduces the resistance of the gate lines, which enables better timing margins for large display panels operating at higher refresh rates.

15 Claims, 9 Drawing Sheets

(51) Int. Cl.
   *H01L 27/32*   (2006.01)
   *H01L 29/786*   (2006.01)
   *H01L 27/12*   (2006.01)
   *H01L 29/49*   (2006.01)

(56) References Cited

U.S. PATENT DOCUMENTS

| | | |
|---|---|---|
| 10,573,670 B2 | 2/2020 | Zhang et al. |
| 10,622,381 B2 | 4/2020 | Miyairi et al. |
| 2009/0146930 A1 | 6/2009 | Nishimura et al. |
| 2009/0174465 A1* | 7/2009 | Sato ............... G11C 16/30 327/535 |
| 2010/0109010 A1 | 5/2010 | Miyake et al. |
| 2010/0245308 A1* | 9/2010 | Takei .............. G06F 3/045 345/206 |
| 2011/0199564 A1* | 8/2011 | Moriwaki ......... H01L 51/5206 313/523 |
| 2011/0291122 A1 | 12/2011 | Shin et al. |
| 2014/0158995 A1 | 6/2014 | Park |
| 2014/0361961 A1* | 12/2014 | Takahara ......... G09G 3/3233 345/76 |
| 2016/0307988 A1 | 10/2016 | Kim et al. |
| 2018/0061908 A1 | 3/2018 | Shim et al. |
| 2019/0267402 A1* | 8/2019 | Zhang ............. H01L 29/42384 |

\* cited by examiner

LARGE PANEL DISPLAYS WITH REDUCED ROUTING LINE RESISTANCE

This application claims the benefit of provisional patent application No. 62/994,747, filed Mar. 25, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

A conventional display typically includes gate drivers for outputting scan control signals to corresponding rows of pixels via respective scan lines. The scan lines are often connected to low-temperature polysilicon (LTPS) transistors and are routed across the face of the display using high resistance metal. This may not be an issue for devices with smaller displays, but for devices with large panel displays operating at high refresh rates such as 120 Hz, the amount of loading on the high resistance scan lines can be so elevated that the rise and fall times of the scan control signals are increased to the point where data can no longer be properly sampled onto the display pixels.

SUMMARY

An electronic device having a display is provided. The display may include an array of pixels formed in an active area. Each pixel may include an organic light-emitting diode coupled to associated thin-film transistor (TFT) structures such as one or more silicon transistors, one or more semiconducting-oxide transistors, and/or one or more capacitors.

The pixels may be formed on a substrate. In particular, the silicon transistor may include an active silicon region formed on the substrate and a gate conductor formed in a first gate metal layer. The capacitor may include a first capacitor terminal formed in the first gate metal layer and a second capacitor terminal formed in a second gate metal layer. The semiconducting-oxide transistor may include a semiconducting-oxide region formed above the second gate metal layer and a gate conductor formed in a third gate metal layer. Conductors formed in the first, second, and third gate metal layers may be formed using high resistance metal such as molybdenum and/or titanium.

The gate conductor of the silicon transistor, the second capacitor terminal, and the gate conductor of the semiconducting-oxide transistor may be coupled to respecting routing lines formed in a first source-drain (SD1) routing layer above the third gate metal layer. Conductors in the SD1 routing layer may be formed using low resistance metal such as aluminum, copper, silver, or gold. The SD1 routing lines coupled to the gate conductors of the silicon transistor and the semiconducting-oxide transistor may serve as gate lines, scan lines, emission lines, initialization lines, reset lines, or other row control lines. Routing the row control lines in the SD1 routing layer can help reduce the resistance on these lines, which will improve timing margin for large display panels operating at high refresh rates.

A first planarization layer may be formed over the SD1 routing layer. A second source-drain (SD2) routing layer may be formed on the first planarization layer. A second planarization layer may be formed on the first planarization layer. Routing lines in the SD2 layer may be configured to route power supply signals such as positive power supply voltages and ground power supply voltages. The power supply lines may be routed in any direction through the active area to help to ensure that the point of the highest voltage drop associated with the ground power supply line is positioned at the center of the display and/or to mitigate luminance differences across the display.

DETAILED DESCRIPTION

Figure 1:
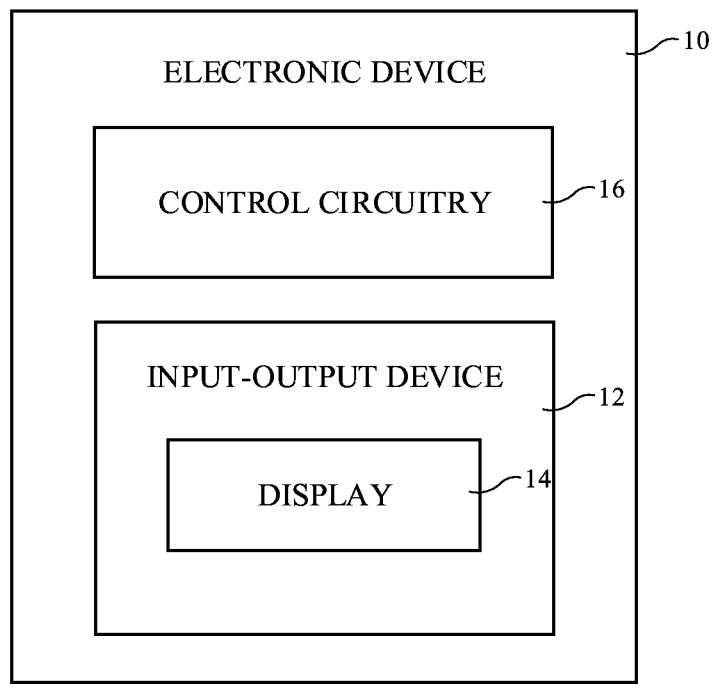
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Display 14 may be an organic light-emitting diode display or may be a display based on other types of display technology. Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2A:
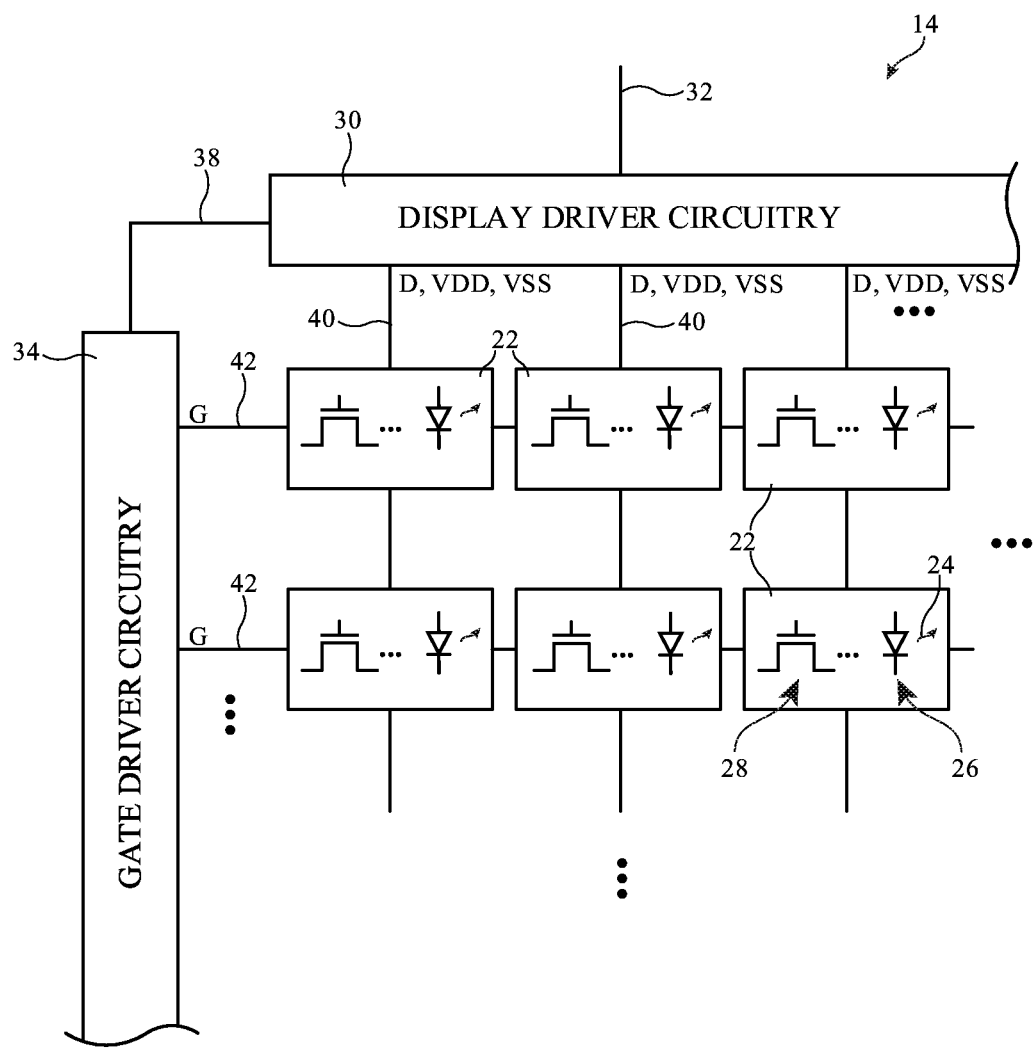
FIG. 2A is a schematic diagram of an illustrative display with an array of light-emitting elements in accordance with an embodiment.

A top view of a portion of display 14 is shown in FIG. 2A. As shown in FIG. 2A, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, and/or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2A may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data onto corresponding data lines while issuing clock signals and other control signals to supporting display driver circuitry such as gate driver circuitry 34 over path 38. Data signals D, positive power supply signals VDD, and ground power supply signals VSS may be supplied to each pixel column via corresponding column lines 40. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines 42 in display 14 may carry gate (G) line signals such as scan line signals, emission enable control signals, reset signals, initialization signals, reference signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area (AA). Electronic device 10 has an external housing with a peripheral edge. The region surrounding the active and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 2B:
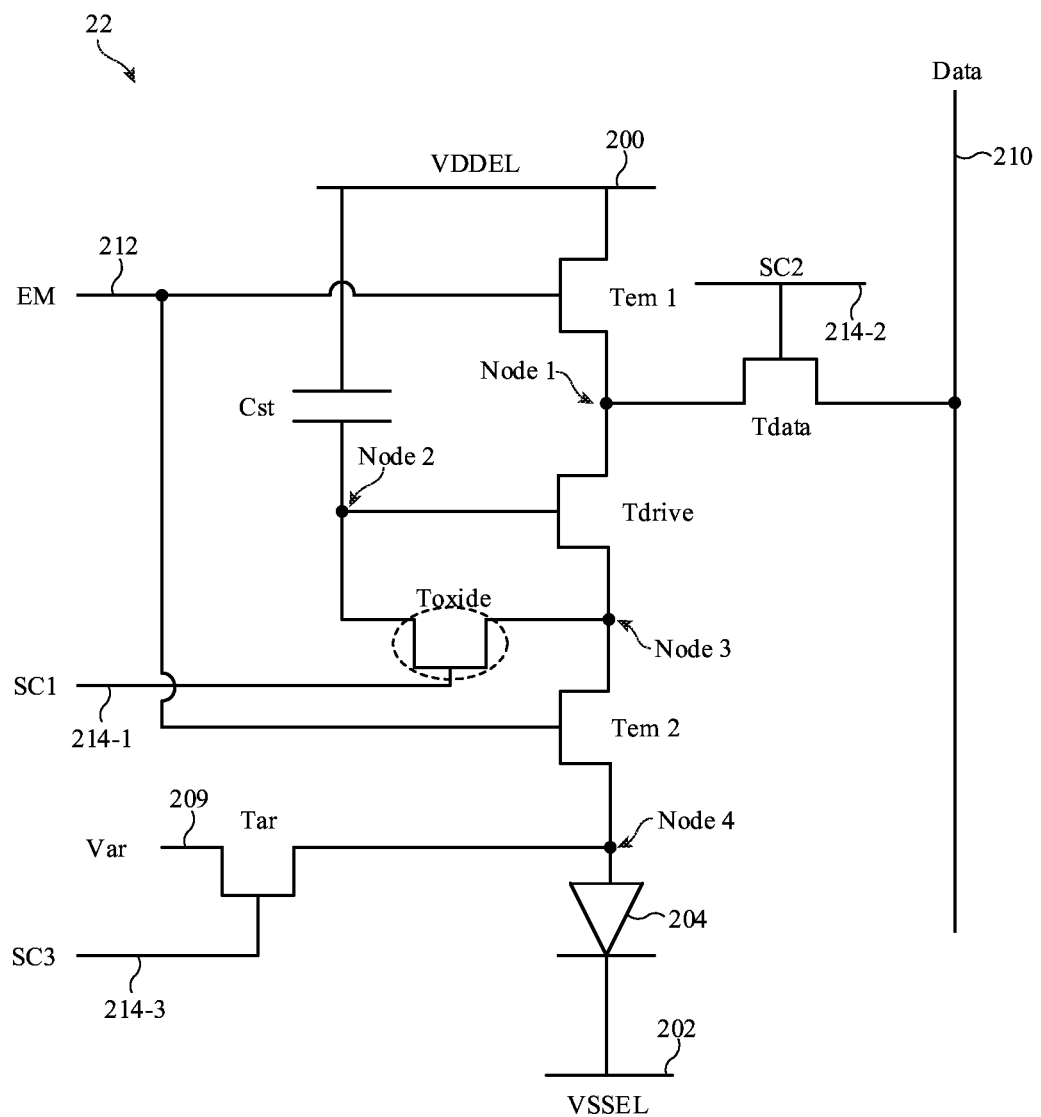
FIG. 2B is a circuit diagram of an illustrative display pixel in accordance with an embodiment.

FIG. 2B is a circuit diagram of an illustrative organic light-emitting diode display pixel 22 in display 14. As shown in FIG. 2B, display pixel 22 may include a storage capacitor Cst and associated pixel transistors such as a semiconducting-oxide transistor Toxide, a drive transistor Tdrive, a data loading transistor Tdata, a first emission transistor Tem1, second emission transistor Tem2, and an anode reset transistor Tar. While transistor Toxide is formed using semiconducting oxide (e.g., a transistor with an n-type channel formed from semiconducting oxide such as indium gallium zinc oxide or IGZO), the other transistors may be thin-film transistors formed from a semiconductor such as silicon (e.g., polysilicon channel deposited using a low temperature process, sometimes referred to as "LTPS" or low-temperature polysilicon). Semiconducting-oxide transistors exhibit relatively lower leakage than silicon transistors, so implementing transistor Toxide as a semiconducting-oxide transistor will help reduce flicker (e.g., by preventing current from leaking away from the gate terminal of drive transistor Tdrive).

In another suitable arrangement, transistors Toxide and Tdrive may be implemented as semiconducting-oxide transistors while the remaining transistors Tdata, Tem1, Tem2, and Tar are silicon (LTPS) transistors. Transistor Tdrive serves as the drive transistor and has a threshold voltage that is critical to the emission current of pixel 22. Since the threshold voltage of transistor Tdrive may experience hysteresis, forming the drive transistor as a top-gate semiconducting-oxide transistor can help reduce the hysteresis (e.g., a top-gate IGZO transistor experiences less Vth hysteresis than a silicon transistor). If desired, any of the remaining transistors Tdata, Tem1, Tem2, and Tar may be implemented as semiconducting-oxide transistors. In yet another suitable arrangement, all transistors within pixel 22 may be implemented as silicon transistors (i.e., pixel 22 need not include any semiconducting-oxide transistors). In general, any of the silicon transistors may be either an n-type (i.e., n-channel) or p-type (i.e., p-channel) LTPS thin-film transistor. If desired, pixel 22 may include more or less than six transistors and/or may include more or less than one internal capacitor.

Display pixel 22 may include an organic light-emitting diode (OLED) 204. A positive power supply voltage VDDEL may be supplied to positive power supply terminal 200, and a ground power supply voltage VSSEL may be supplied to ground power supply terminal 202. Positive power supply voltage VDDEL may be 3 V, 4 V, 5 V, 6 V, 7 V, 2 to 8 V, or any suitable positive power supply voltage level. Ground power supply voltage VSSEL may be 0 V, −1 V, −2 V, −3 V, −4 V, −5 V, −6V, −7 V, or any suitable ground or negative power supply voltage level. The state of drive transistor Tdrive controls the amount of current flowing from terminal 200 to terminal 202 through diode 204, and therefore the amount of emitted light from display pixel 22. Organic light-emitting diode 204 may have an associated parasitic capacitance COLED (not shown).

Terminal 209 may be used to supply an anode reset voltage Var to assist in turning off diode 204 when diode 204 is not in use. Terminal 209 is therefore sometimes referred to as an anode reset or initialization line. Control signals from display driver circuitry such as row driver circuitry 34 of FIG. 2A are supplied to control terminals such as row control terminals 212, 214-1, 214-2, and 214-3. Row control terminal 212 may serve as an emission control terminal (sometimes referred to as an emission line or emission control line), whereas row control terminals 214-1, 214-2, and 214-3 may serve as first, second, and third scan control terminals (sometimes referred to as scan lines or scan control lines). Emission control signal EM may be supplied to terminal 212. Scan control signals SC1, SC2, and SC3 may be applied to scan terminals 214-1, 214-2, and 214-3, respectively. A data input terminal such as data signal terminal 210 is coupled to a respective data line D of FIG. 2A for receiving image data for display pixel 22. Data terminal 210 may also be referred to as a data line.

In the example of FIG. 2B, transistors Tem1, Tdrive, Tem2, and OLED 304 may be coupled in series between power supply terminals 200 and 202. In particular, first emission control transistor Tem1 may have a source terminal that is coupled to positive power supply terminal 200, a gate terminal that receives emission control signal EM2 via emission line 212, and a drain terminal (labeled as Node1). The terms "source" and "drain" terminals of a transistor can sometimes be used interchangeably and may therefore sometimes be referred to as "source-drain" terminals. Drive transistor Tdrive may have a source terminal coupled to Node1, a gate terminal (labeled as Node2), and a drain terminal (labeled as Node3). Second emission control transistor Tem2 may have a source terminal coupled to Node3, a gate terminal that also receives emission control signal EM via emission line 212, and a drain terminal (labeled as Node4) coupled to ground power supply terminal 202 via light-emitting diode 204. Configured in this way, emission control signal EM can be asserted to turn on transistors Tem1 and Tem2 during an emission phase to allow current to flow through light-emitting diode 204.

Storage capacitor Cst may have a first terminal that is coupled to positive power supply line 200 and a second terminal that is coupled to Node2. Image data that is loaded into pixel 22 can be at least be partially stored on pixel 22 by using capacitor Cst to hold charge throughout the emission phase. Transistor Toxide may have a source terminal coupled to Node2, a gate terminal configured to receive scan control signal SC1 via scan line 214-1, and a drain terminal coupled to Node3. Signal SC1 may be asserted to turn on transistor Toxide to short the drain and gate terminals of transistor Tdrive. A transistor configuration where the gate and drain terminals are shorted is sometimes referred to as being "diode-connected."

Data loading transistor Tdata may have a source terminal coupled to data line 210, a gate terminal configured to receive scan control signal SC2 via scan line 214-2, and a drain terminal coupled to Node1. Configured in this way, signal SC2 can be asserted to turn on transistor Tdata, which will allow a data voltage from data line 210 to be loaded onto Node1. Transistor Tar may have a source terminal coupled to Node4, a gate terminal configured to receive scan control signal SC3 via scan line 214-3, and a drain terminal coupled to initialization line 209. Configured in this way, scan control signal SC3 can be asserted to turn on transistor Tar, which drives Node4 to the anode reset voltage level Var. If desired, the anode reset voltage Var on line 209 can be dynamically biased to different levels during operation of pixel 22.

Figure 3:
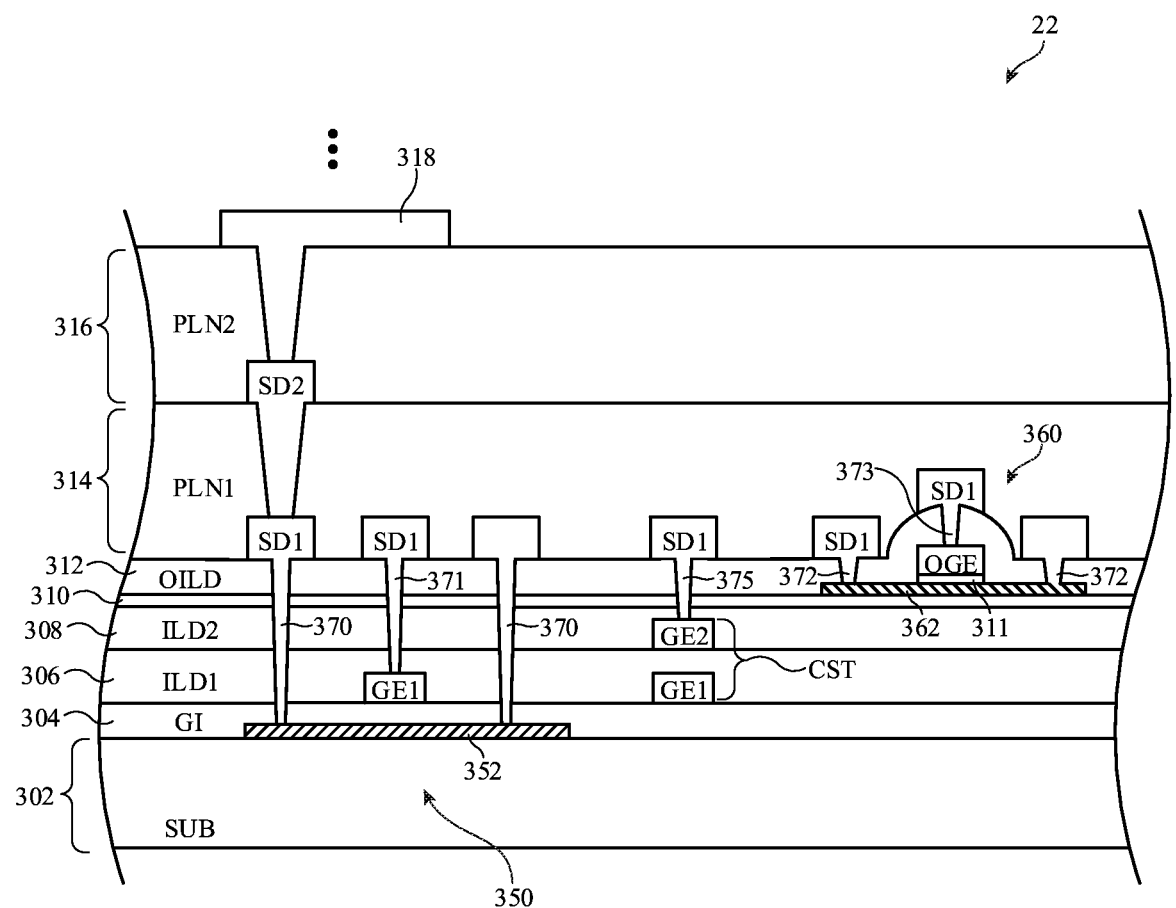
FIG. 3 is a cross-sectional side view of an illustrative thin-film transistor circuitry in a display in accordance with an embodiment.

FIG. 3 is a cross-sectional side view of an illustrative thin-film transistor circuitry that may be included within display pixel 22 in accordance with an embodiment. As shown in FIG. 3, the display stackup may include a substrate layer such as substrate 302, which may include one or more semiconducting layers, one or more insulation layers, a combination of semiconducting layers and insulations layers, one or more buffer layers, etc. In some embodiments, substrate 302 may be formed from glass, metal, plastic, ceramic, sapphire, or other suitable substrate materials. As examples, substrate 302 may be an organic substrate formed from polyimide (PI), polyethylene terephthalate (PET), or polyethylene naphthalate (PEN). The surface of substrate 302 may optionally be covered with one or more buffer layers (e.g., inorganic buffer layers such as layers of silicon oxide, silicon nitride, etc.).

A polysilicon layer (e.g., an LTPS layer) may be formed on substrate 302, patterned, and etched to form LTPS region 352. The two opposing ends of LTPS region 406 may optionally be doped (e.g., n-doped or p-doped) to form source-drain regions of silicon transistor 350. Thin-film silicon transistor 350 in the cross section of FIG. 3 may generically represent any LTPS transistor within pixel 22.

Gate insulator layer 304 may be formed on substrate 302 and over silicon region 352. A first metal layer (e.g., a first gate metal layer "GE1") may be formed over the gate insulator layer 304. The first metal layer may be patterned and etched to form the gate conductor of transistor 350. In the example of FIG. 3, the first metal layer may also be patterned and etched to form a first terminal of storage capacitor Cst (e.g., GE1 may also be used to form the bottom plate of the storage capacitor). Any additional capacitor structure within pixel 22 (not shown in FIG. 3 in order not to obscure the present embodiments) may also have one of its capacitor terminal formed in the GE1 metal layer.

A first interlayer dielectric (ILD1) layer 306 may be formed over the first gate metal layer GE1 and silicon transistor 350. Dielectric layer 306 may (for example) be formed from silicon nitride, silicon oxide, and other suitable insulating material. A second metal layer (e.g., a second gate metal layer "GE2") may be formed on ILD1 layer 306. The second metal layer may be patterned and etched to form a second terminal of storage capacitor Cst (e.g., GEe may be used to form the top plate of the storage capacitor). If desired, any additional capacitor structure within pixel 22 (not shown in FIG. 3 in order not to obscure the present embodiments) may also have one of its capacitor terminal formed in the GE2 metal layer.

A second interlayer dielectric (ILD2) layer 308 may be formed over the second gate metal layer GE2 and over capacitor Cst. Dielectric layer 308 may be formed from silicon nitride, silicon oxide, and other suitable insulating material. One or more buffer layers such as buffer layer 310 (e.g., an inorganic buffer layer such silicon oxide layer, silicon nitride layer, etc.) may be formed over dielectric layer 308.

A semiconducting-oxide layer (e.g., an IGZO layer) may be formed over buffer layer 310, which is sometimes referred to as an oxide buffer layer. The semiconducting-oxide layer may be patterned and etched to form semiconducting-oxide region 362. An insulation layer such as gate insulator layer 311 may be formed on IGZO region 362. An oxide (third) gate metal layer "OGE" may be formed on gate insulator layer 311 to serve as the gate conductor for semiconducting-oxide transistor 360. The source-drain regions of oxide region 362 may be n-doped or p-doped via hydrogenation, ion implantation, or other suitable doping methods. Another interlayer dielectric (OILD) layer 312 may be formed on buffer layer 310 and over transistor 360. Thin-film semiconducting-oxide transistor 360 in the cross section of FIG. 3 may generically represent any semiconducting-oxide transistor within pixel 22. In yet other suitable arrangements where pixel 22 does not include any semiconducting-oxide transistor, one or more of layers such as the oxide buffer layer 310, semiconducting-oxide region 362, gate liner 311, the OGE layer, and/or the oxide ILD layer 312 may not be formed when manufacturing pixel 22.

A first interconnect layer above silicon transistor 350 and above semiconducting-oxide transistor 360 may be formed on dielectric layer 312. Conductive routing structures formed in the first interconnect layer may be coupled down to the source-drain regions of each underlying transistor in pixel 22 and may therefore sometimes be referred to as the first source-drain metal layer "SD1." In the example of FIG. 3, the source-drain terminals of silicon region 352 may be coupled to corresponding SD1 conductors through conductive vias 370 (e.g., contacts 370 traversing layers 304, 306, 308, 310, and 312). The source-drain terminals of semiconducting-oxide region 362 may also be coupled to corresponding SD1 conductors through conductive vias 372 (e.g., contacts 372 traversing layer 312).

The gate metal conductors may also be coupled to the SD1 routing conductors. For instance, the GE1 gate conductor of silicon transistor 350 may be coupled to a corresponding SD1 conductor through conductive via 371. The OGE gate conductor of optional semiconducting-oxide transistor 360 may be coupled to a corresponding SD1 conductor through conductive via 373. The GE2 top plate terminal of the capacitor may also be coupled to a corresponding SD1 conductor through conductive via 375.

A first planarization (PLN1) layer such as layer 314 may be formed over the SD1 metal routing layer. A second interconnect layer may further be formed on the first planarization layer 314. Conductive routing structures formed in the second interconnect layer may be coupled down to the SD1 conductors and may therefore sometimes be referred to as the second source-drain metal layer "SD2."

A second planarization (PLN2) layer such as layer 316 may be formed on planarization layer 314 and over the SD2 routing metal lines. Planarization layer 314 and 316 may be formed from organic dielectric materials such as a polymer. In contrast, the layers below the organic planarization layers such as layers 304, 306, 308, 310, and 312 are typically formed from inorganic dielectric material such as silicon nitride, silicon oxide, etc.

Anode 318 (e.g., the anode terminal of the organic light-emitting diode 204 of FIG. 2B) may be formed over second planarization layer 316. Additional structures may be formed over anode 318. For example, a pixel definition layer, light-emitting diode emissive material, cathode, and other pixel structures may also be included in the stackup of display pixel 22. However, these additional structures are omitted for the sake of brevity.

The GE1 gate conductor of a display pixel silicon transistor, the GE2 capacitor terminal of a display pixel capacitor, and the OGE gate conductor of a display pixel semiconducting-oxide transistor are typically formed using a high resistance material such as molybdenum, titanium, some combination of high resistance materials, or other suitable metal. These gate metal conductors need to be formed using such high resistivity material due to the requirements of LTPS process that is used in the process of manufacturing the silicon transistors.

Figure 4:
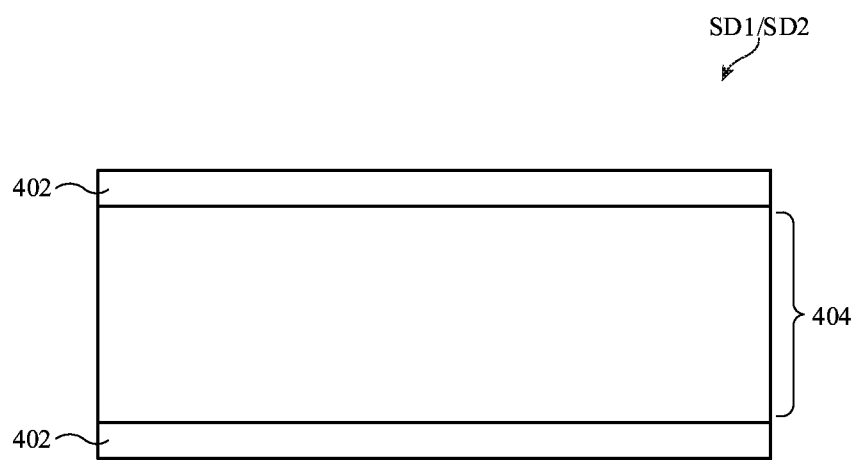
FIG. 4 is a cross-sectional side view of an illustrative low resistance routing structure in accordance with an embodiment.

FIG. 4 is a cross-sectional side view of an illustrative SD1 or SD2 routing conductor. As shown in FIG. 4, the SD1/SD2 routing conductor may include a low resistance material 404 that is optionally sandwiched between two high resistance liners 402. Liners 402 may be formed using molybdenum, titanium, some combination of high resistivity material, or other suitable metal. In contrast, the bulk of the SD1/SD2 conductor may include material 404 that is formed from aluminum, copper, silver, gold, zinc, brass, some combination of low resistivity material, and other suable metal with high conductivity. Formed in this way, the SD1/SD2 conductors may exhibit substantially higher conductivity and less resistance than the GE1/GE2/OGE conductors. For example, the "low" resistance SD1/SD2 metal routing structures may exhibit a sheet resistance of about $0.05\Omega/\square$, $0.01$-$0.05$ $\Omega/\square$, $0.05$-$0.1$ $\Omega/\square$, or less than $0.01\Omega/\square$. The "high" resistance GE1/GE2/OGE metal structures may exhibit a sheet resistance of about $0.5\Omega/\square$, $0.1$-$0.5$ $\Omega/\square$, $0.5$-$1.0$ $\Omega/\square$, or greater than $1.0\Omega/\square$. In general, the resistivity of GE1/GE2/OGE metal structures may be at least 5×, at least 10×, at least 100× the resistivity of the SD1/SD2 metal structures.

In conventional displays, the scan control signals may be routed across the face of the display using scan lines formed from the high resistance metal. For instance, the scan line feeding the gate terminal of the silicon transistor is routed in the GE1 metal layer, and the scan line feeding the gate terminal of the semiconducting-oxide transistor is routed in the OGE metal layer. Interconnections associated with the capacitor are also routed in the GE2 metal layer. Routing scan lines or gate lines using high resistivity material in this way may be acceptable for devices with smaller displays. For devices with large panel displays operating at high refresh rates (e.g., refresh rates of 120 Hz, more than 60 Hz, or more than 120 Hz, etc.), however, the amount of loading on the high resistance scan lines can be so elevated that the resulting rise and fall times of the gate line signals are increased to the point where data can no longer be properly sampled onto the display pixels.

Figure 5:
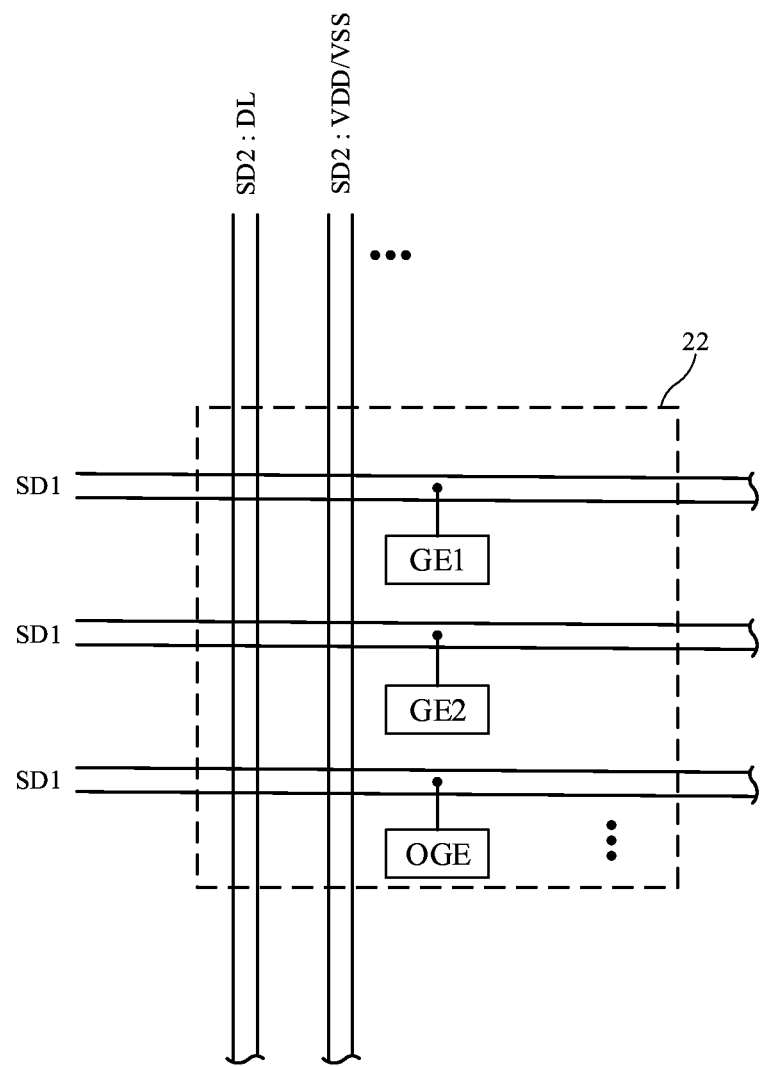
FIG. 5 is a top plan view of a display pixel illustrating how gate conductors are coupled to routing lines formed in a first source-drain (SD1) layer in accordance with an embodiment.

In accordance with an embodiment, gate line signals such as scan control signals, emission control signals, reset signals, initialization signals, reference signals, enable signals, power supply signals (e.g., positive power supply voltages or ground power supply voltages), and/or other row control signals may be routed across the face of the display using low resistance material such as the SD1 metal routing layer (see, e.g., FIG. 5). FIG. 5 is a top plan (layout) view of pixel 22 illustrating how gate conductors are coupled to routing lines formed in the SD1 metal routing layer. As shown in FIG. 5, a first row control line coupled to the GE1 metal conductor in pixel 22, a second row control line coupled to the GE2 metal conductor in pixel 22, and a third row control line coupled to the OGE metal conductor in pixel 22 are all routed across the face of the display using the low resistance SD1 routing layer (e.g., the control lines are routed through at least two pixels 22, at least 10 pixels 22, at least 100 pixels, or any suitable number of pixels along a given pixel row). If desired, other row control signals associated with display pixel 22 may also be routed using SD1 metal. In the example of FIG. 5, the data line (DL), the positive power supply (VDD) line, and the ground power supply (VSS) line may be routed in the column direction using routing lines formed in the SD2 metal routing layer (e.g., the SD2 routing lines may be routed across at least two pixels, at least 10 pixels, at least 100 pixels, or any suitable number of pixels in a pixel column). The SD2 routing lines may be perpendicular to the SD1 routing lines. In general, the terms "row" and "column" may be used interchangeably depending on the orientation of the display. If desired, the SD1 routing lines may also be routed in parallel with the SD1 routing lines.

Configured and operated in this way, the resistance of the gate lines being routed across the display panel will be drastically reduced (e.g., by at least 5×, at least 10×, or more), which can reduce the rise and fall times of the gate line signals so that data signals can be properly loaded into large display panels operating at high refresh rates. By reducing the loading on the gate lines, brightness uniformity of the display can also be improved.

Figure 6:
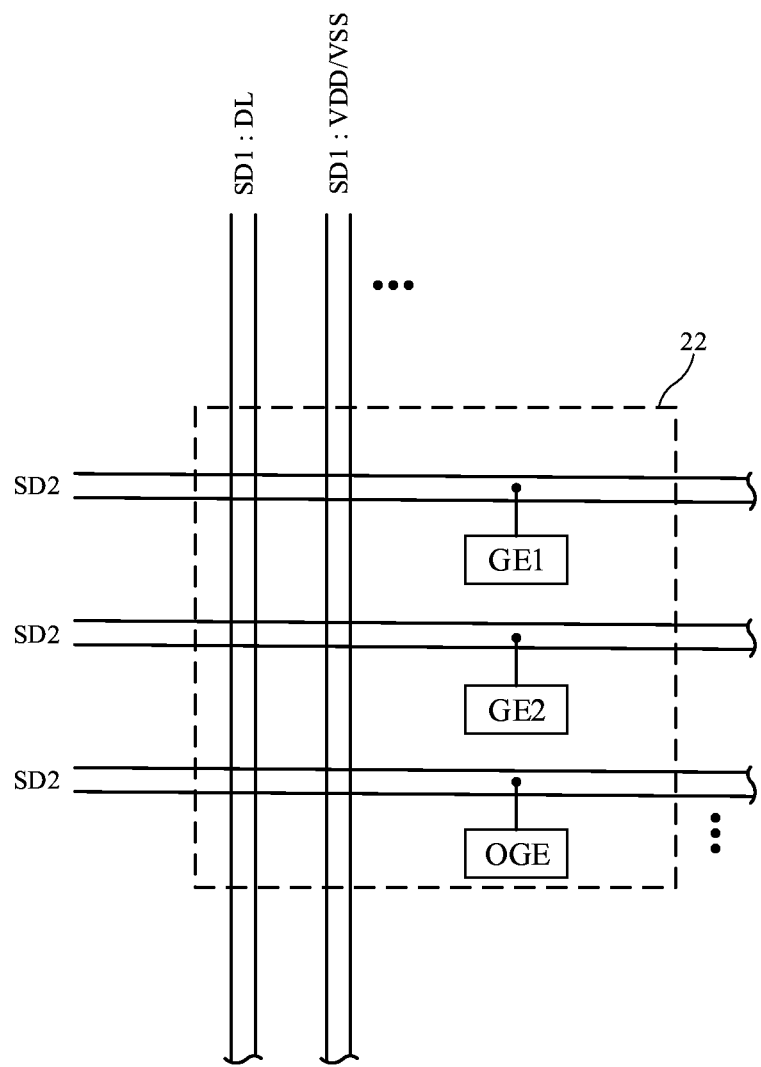
FIG. 6 is a top plan view of a display pixel illustrating how gate conductors are coupled to routing lines formed in a second source-drain (SD2) layer in accordance with an embodiment.

The example of FIG. 6 in which the row control signals are routed using SD1 metal lines and the column control signals are routed using SD2 metal lines is merely illustrative and is not intended to limit the scope of the present embodiments. FIG. 6 illustrates another suitable arrangement in which the row control signals (e.g., gate line lines, scan signals, emission signals, reset signals, initialization signals, etc.) are routed using SD2 metal lines and the column control signals (e.g., data signals, power supply signals, etc.) are routed using SD1 metal lines. Although SD1 and SD2 are shown as being perpendicular to one another, they may also be routed in parallel with one another (if desired).

Figure 7:
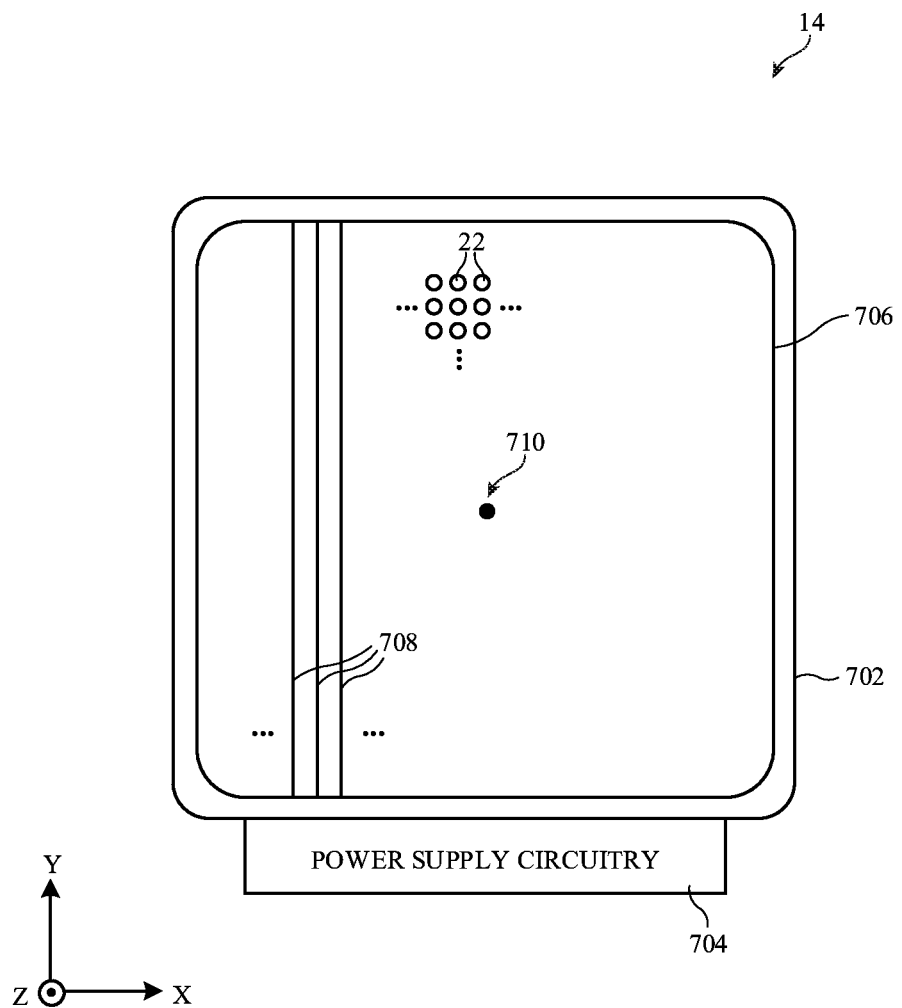
FIG. 7 is a top plan view of a display illustrating how multiple ground power supply lines can be routed across the face of the display in accordance with an embodiment.

FIG. 7 is a top plan (layout) view of display 14 illustrating how multiple ground power supply lines can be routed across the face of the display in accordance with an embodiment. As shown in FIG. 7, display 14 may have a peripheral edge 702, power supply circuitry 704 formed along the bottom edge of the periphery (when viewing display 14 in direction Z at the face of the display that is parallel with the XY plane). Power supply circuitry 704 may be configured to supply a ground power supply voltage VSS onto a ground line 706 that is routed along the entire peripheral edge 702 of display 14. In accordance with an embodiment, additional ground lines such as ground lines 708 may be routed across the face of display 14 in a direction Y that is perpendicular to the bottom peripheral edge of the display along which power supply circuitry 704 is formed. For example, ground lines 708 may be formed in every pixel column, in every other pixel column, every 2-10 pixel columns, or at other suitable intervals.

Configured in this way, ground lines 708 can help provide a lower resistance current path for pixels further away from the edge of the display so that the pixels experiencing the highest current-resistance ("IR" or voltage) drop at the power supply terminal are positioned at the center of display 14, as indicated by point 710. Without forming ground lines 708 in this way, the point of the highest IR drop may undesirably drift towards the upper peripheral edge of the display, which will reduce the driving margin of pixels near the center of the display while increasing the overall power consumption.

Figure 8:
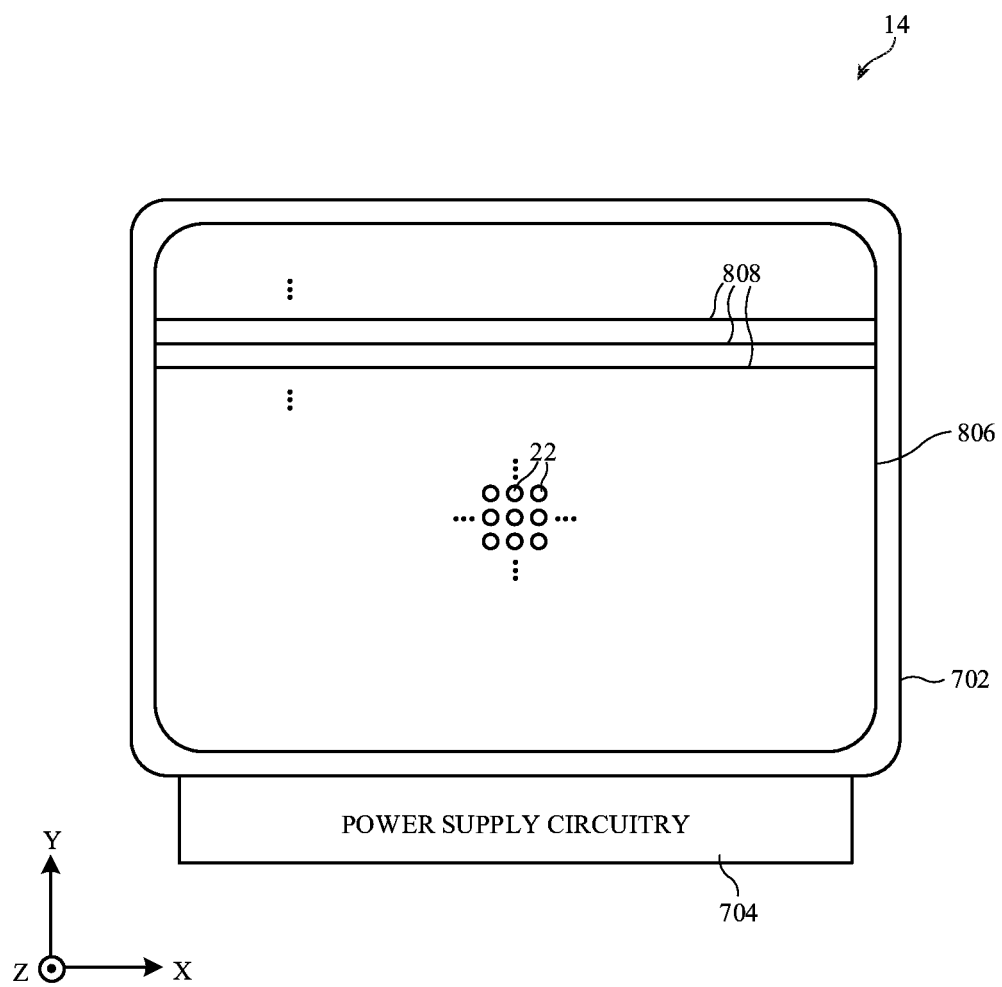
FIG. 8 is a top plan view of a display illustrating how multiple positive power supply lines can be routed across the face of the display in accordance with an embodiment.

Unlike the routing of VSS lines, the routing of VDD lines may impact the luminance of the display. For example, if the resistance on the VDD current path is high, the overall luminance for a column of pixels with more black pixels may be higher than the luminance for a column of pixels with fewer black pixels. To help mitigate this shift in luminance, multiple positive power supply (VDD) lines can be routed across the face of the display (see, e.g., FIG. 8). As shown in FIG. 8, display 14 may have a peripheral edge 702, power supply circuitry 704 formed along the bottom edge of the periphery (when viewing display 14 in direction Z at the face of the display that is parallel with the XY plane). Power supply circuitry 704 may be configured to supply positive power supply voltage VDD onto a power line 806 that is routed along the peripheral edge 702 of display 14.

In accordance with an embodiment, additional power lines such as positive power supply lines 808 may be routed across the face of display 14 in a direction X that is parallel to the bottom peripheral edge of the display along which power supply circuitry 704 is formed. For example, the VDD lines 808 may be formed in every pixel row, in every other pixel row, every 2-10 pixel rows, or at other suitable intervals. Configured in this way, power supply lines 808 can help provide a lower resistance current path for pixels further away from the edge of the display so that the display luminance will remain the same regardless of the number of darker pixels in each column.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   display driver circuitry configured to generate display driver signals;
   a plurality of pixels formed on a substrate in an active area, wherein each pixel in the plurality of pixels comprises a silicon transistor formed on the substrate, wherein the silicon transistor comprises a gate conductor formed in a first gate metal layer, and wherein the gate conductor of the silicon transistor has a first resistance; and
   a control line formed above the gate conductor of the silicon transistor, wherein the control line is configured to provide the display driver signals generated from the display driver circuitry to the gate conductor of the silicon transistor in at least two of the plurality of pixels in the active area, and wherein the control line is formed in a first source-drain layer using material having a second resistance that is less than the first resistance.

2. The display of claim 1, wherein each pixel in the plurality of pixels further comprises:
   a capacitor having a first terminal formed in the first gate metal layer.

3. The display of claim 2, wherein the capacitor further comprises:
   a second terminal formed in a second gate metal layer above the first gate metal layer.

4. The display of claim 3, further comprising:
   an additional control line routed to the second terminal of the capacitor in the at least two of the plurality of pixels in the active area, wherein the additional control line is formed in the first source-drain layer using the material having the second resistance.

5. The display of claim 3, wherein each pixel in the plurality of pixels further comprises:
   a semiconducting-oxide transistor formed above the silicon transistor, wherein the semiconducting-oxide transistor comprises a gate conductor formed in a third gate metal layer, and wherein the gate conductor of the semiconducting-oxide transistor has a third resistance that is higher than the second resistance; and
   an additional control line formed above the gate conductor of the semiconducting-oxide transistor, wherein the additional control line is configured to provide the display driver signals generated from the display driver circuitry to the gate conductor of the semiconducting-oxide transistor in the at least two of the plurality of pixels, and wherein the additional control line is formed in the first source-drain layer using the material having the second resistance.

6. The display of claim 5, wherein the control line and the additional control line comprise gate lines configured to carry scan signals.

7. The display of claim 1, further comprising:
   a first planarization layer formed over the silicon transistor;
   additional conductive lines formed in a second source-drain layer on the first planarization layer; and
   a second planarization layer formed over the additional conductive lines.

8. The display of claim 7, wherein the additional conductive lines are configured to route data signals to at least two of the plurality of pixels in the active area.

9. The display of claim 8, wherein the additional conductive lines are configured to route positive power supply signals to at least two of the plurality of pixels in the active area.

10. The display of claim 7, wherein the additional conductive lines are configured to route ground power supply signals to at least two of the plurality of pixels in the active area.

11. The display of claim 7, wherein the additional conductive lines are perpendicular to the control line.

12. The display of claim 1, wherein the first resistance is at least five times greater than the second resistance.

13. The display of claim 1, wherein the first resistance is at least ten times greater than the second resistance.

14. The display of claim 1, wherein the gate conductor of the silicon transistor is formed using molybdenum.

15. The display of claim 1, wherein the material in the first source-drain layer is formed using metals selected from the group consisting of: aluminum, copper, silver, and gold.

* * * * *